US011152672B2

(12) United States Patent
Mack et al.

(10) Patent No.: US 11,152,672 B2
(45) Date of Patent: *Oct. 19, 2021

(54) BATTERY MODULE BUS BAR CARRIER HAVING GUIDE EXTENSIONS SYSTEM AND METHOD

(71) Applicant: CPS Technology Holdings LLC, New York, NY (US)

(72) Inventors: Robert J. Mack, Milwaukee, WI (US); Dale B. Trester, West Allis, WI (US); Richard M. DeKeuster, Racine, WI (US); Jennifer L. Czarnecki, Franklin, WI (US); Jason D. Fuhr, Sussex, WI (US)

(73) Assignee: CPS Technology Holdings LLC, New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/880,727

(22) Filed: May 21, 2020

(65) Prior Publication Data

US 2020/0287197 A1    Sep. 10, 2020

Related U.S. Application Data

(63) Continuation of application No. 14/634,516, filed on Feb. 27, 2015, now Pat. No. 10,665,848.

(Continued)

(51) Int. Cl.
*H01M 2/30* (2006.01)
*H01M 50/543* (2021.01)

(Continued)

(52) U.S. Cl.
CPC ...... *H01M 50/543* (2021.01); *G01R 31/3835* (2019.01); *G01R 31/396* (2019.01);
(Continued)

(58) Field of Classification Search
CPC ............. H01M 50/529; H01M 50/502; H01M 50/528; H01M 50/147
See application file for complete search history.

(56) References Cited

U.S. PATENT DOCUMENTS 6,320,121 B1    11/2001    Honeycutt
6,896,995 B2    5/2005     Saito
(Continued)

FOREIGN PATENT DOCUMENTS

EP    2442383    4/2012
EP    2894695    7/2015
(Continued)

OTHER PUBLICATIONS

International Search Report and Written Opinion of the International Search Authority dated May 2, 2016 for Int'l. Appln. No. PCT/US2016/013747.

*Primary Examiner* — Michael L Dignan
(74) *Attorney, Agent, or Firm* — Boardman & Clark LLP

(57) ABSTRACT

The present disclosure includes a battery module having a stack of electrochemical cells that includes terminals, a housing that receives the stack of electrochemical cells, and a bus bar carrier disposed over the stack of electrochemical cells such that bus bars disposed on the bus bar carrier interface with the terminals of the stack of electrochemical cells.

12 Claims, 9 Drawing Sheets

Related U.S. Application Data

(60) Provisional application No. 62/100,001, filed on Jan. 5, 2015.

(51) Int. Cl.

| | |
|---|---|
| *H01M 10/052* | (2010.01) |
| *G01R 31/396* | (2019.01) |
| *G01R 31/3835* | (2019.01) |
| *H01M 10/02* | (2006.01) |
| *H01M 10/60* | (2014.01) |
| *H01M 10/65* | (2014.01) |
| *H01M 50/10* | (2021.01) |
| *H01M 50/20* | (2021.01) |
| *H01M 50/30* | (2021.01) |
| *H01M 50/35* | (2021.01) |
| *H01M 50/50* | (2021.01) |
| *H01M 50/147* | (2021.01) |
| *H01M 50/256* | (2021.01) |
| *H01M 50/308* | (2021.01) |
| *H01M 50/342* | (2021.01) |
| *H01M 50/463* | (2021.01) |
| *H01M 50/502* | (2021.01) |
| *H01M 50/528* | (2021.01) |
| *H01M 50/529* | (2021.01) |
| *H01M 50/571* | (2021.01) |
| *H01M 50/572* | (2021.01) |
| *H01M 10/48* | (2006.01) |
| *H01M 10/613* | (2014.01) |
| *H01M 10/625* | (2014.01) |
| *H01M 10/647* | (2014.01) |
| *H01M 10/653* | (2014.01) |
| *H01M 10/6551* | (2014.01) |
| *H01M 10/0525* | (2010.01) |
| *H01M 10/42* | (2006.01) |
| *H01M 10/6557* | (2014.01) |
| *H01M 10/04* | (2006.01) |
| *H01M 10/058* | (2010.01) |

(52) U.S. Cl.
CPC ....... *H01M 10/02* (2013.01); *H01M 10/0413* (2013.01); *H01M 10/052* (2013.01); *H01M 10/058* (2013.01); *H01M 10/0525* (2013.01); *H01M 10/4207* (2013.01); *H01M 10/4257* (2013.01); *H01M 10/482* (2013.01); *H01M 10/60* (2015.04); *H01M 10/613* (2015.04); *H01M 10/625* (2015.04); *H01M 10/647* (2015.04); *H01M 10/65* (2015.04); *H01M 10/653* (2015.04); *H01M 10/6551* (2015.04); *H01M 10/6557* (2015.04); *H01M 50/10* (2021.01); *H01M 50/147* (2021.01); *H01M 50/20* (2021.01); *H01M 50/256* (2021.01); *H01M 50/30* (2021.01); *H01M 50/308* (2021.01); *H01M 50/342* (2021.01); *H01M 50/3425* (2021.01); *H01M 50/35* (2021.01); *H01M 50/463* (2021.01); *H01M 50/50* (2021.01); *H01M 50/502* (2021.01); *H01M 50/528* (2021.01); *H01M 50/529* (2021.01); *H01M 50/571* (2021.01); *H01M 50/572* (2021.01); *H01M 2010/4271* (2013.01); *H01M 2220/10* (2013.01); *H01M 2220/20* (2013.01)

(56) References Cited

U.S. PATENT DOCUMENTS

| | | | |
|---|---|---|---|
| 7,118,827 B2 | 10/2006 | Kruger et al. | |
| 7,285,724 B2 | 10/2007 | Buettner | |
| 7,754,374 B2 | 7/2010 | Hashida et al. | |
| 7,952,026 B2 | 5/2011 | Ramsey | |
| 8,014,131 B2 | 9/2011 | Hudgins, Jr. et al. | |
| 8,293,392 B2 | 10/2012 | Park et al. | |
| 8,319,106 B2 | 11/2012 | Wagener | |
| 8,420,934 B2 | 4/2013 | Zhang | |
| 8,652,678 B2 | 2/2014 | Musetti | |
| 8,815,429 B2 | 8/2014 | Hostler et al. | |
| 9,184,424 B2 | 11/2015 | Arena et al. | |
| 9,350,127 B2 | 5/2016 | Callicoat | |
| 9,450,226 B2 | 9/2016 | Morgan et al. | |
| 2010/0136420 A1 | 6/2010 | Shin | |
| 2011/0059342 A1* | 3/2011 | Lee | H01M 10/482 |
| | | | 429/93 |
| 2011/0269001 A1 | 11/2011 | Onuki et al. | |
| 2012/0094158 A1 | 4/2012 | Wuensche | |
| 2012/0094164 A1 | 4/2012 | Wuensche | |
| 2014/0054061 A1 | 2/2014 | Kaishian et al. | |
| 2014/0212723 A1 | 7/2014 | Lee et al. | |
| 2014/0322581 A1 | 10/2014 | Ruter et al. | |
| 2014/0363711 A1 | 12/2014 | Zhao | |
| 2015/0010801 A1 | 1/2015 | Arena et al. | |
| 2015/0064540 A1* | 3/2015 | Roh | H01M 50/20 |
| | | | 429/153 |
| 2015/0171402 A1 | 6/2015 | Gonzales et al. | |
| 2015/0207127 A1 | 7/2015 | Davis et al. | |
| 2016/0056427 A1* | 2/2016 | Kim | H01M 50/502 |
| | | | 429/90 |
| 2016/0197329 A1 | 7/2016 | Mack et al. | |

FOREIGN PATENT DOCUMENTS

| | | |
|---|---|---|
| WO | 2013113087 A1 | 8/2013 |
| WO | 2014011801 | 1/2014 |

* cited by examiner

BATTERY MODULE BUS BAR CARRIER HAVING GUIDE EXTENSIONS SYSTEM AND METHOD

CROSS-REFERENCE TO RELATED APPLICATIONS

This application is a continuation of and claims priority to U.S. Nonprovisional application Ser. No. 14/634,516, filed Feb. 27, 2015, entitled "BATTERY MODULE BUS BAR CARRIER HAVING GUIDE EXTENSIONS SYSTEM AND METHOD," now U.S. Pat. No. 10,665,848 issued May 26, 2020, which claims priority from and the benefit of U.S. Provisional Application No. 62/100,001, filed Jan. 5, 2015, entitled "MECHANICAL AND ELECTRICAL ASPECTS OF LITHIUM ION BATTERY MODULE WITH VERTICAL AND HORIZONTAL CONFIGURATIONS," each of which is hereby incorporated by reference in its entirety for all purposes.

BACKGROUND

The present disclosure relates generally to the field of batteries and battery modules. More specifically, the present disclosure relates to a battery module carrier (e.g., a bus bar carrier).

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles. For example, in traditional configurations, battery modules may include electrochemical cells coupled in electrical communication with each other via individual bus bars disposed onto or over adjacent terminals of the electrochemical cells. The bus bars in traditional configurations may be individually coupled to adjacent terminals, thereby reducing manufacturing efficiency and accuracy of the traditional battery module. Further, traditional battery modules may include electrochemical cells with certain features (e.g., terminals) that are not properly aligned due to engineering tolerances, thereby complicating alignment of the bus bars to couple adjacent terminals. Accordingly, there is a need for improved alignment and coupling of electrochemical cells, their corresponding terminals, and the bus bars that couple their corresponding terminals.

SUMMARY

A summary of certain embodiments disclosed herein is set forth below. It should be understood that these aspects are presented merely to provide the reader with a brief summary of certain embodiments and that these aspects are not intended to limit the scope of this disclosure. Indeed, this disclosure may encompass a variety of aspects that may not be set forth below.

A battery module includes a housing having an interior surface, and a stack of electrochemical cells disposed in the housing. The stack including a first end and a second end opposite the first end. The first end having terminals of the electrochemical cells, a first surface and a second surface of a first electrochemical cell and a second electrochemical cell, respectively. The first surface and the second surface extending between the first end and the second end of the stack. The battery module further includes a plurality of bus bars and a bus bar carrier supporting the plurality of bus bars. The bus bar carrier is adjacent to the first end of the stack such that the plurality of bus bars interfaces with the terminals of the first end. The bus bar carrier has a first guide extension and a second guide extension. The first guide extension includes a third surface and a fourth surface opposite the third surface. The second guide extension includes a fifth surface and a sixth surface opposite the sixth surface. The third surface physically contacts the first surface, the fourth surface physically contacting the interior surface of the housing, and the fifth surface physically contacting the second surface.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a number of battery cells (e.g., lithium-ion (Li-ion) electrochemical cells) arranged and electrically interconnected to provide particular voltages and/or currents useful to power, for example, one or more components of an xEV. As another example, battery modules in accordance with present embodiments may be incorporated with or provide power to stationary power systems (e.g., non-automotive systems).

In accordance with embodiments of the present disclosure, the battery module may include a housing configured to receive electrochemical cells through an open side of the housing, and a bus bar carrier disposed into the open side of the housing and having bus bars disposed on the bus bar carrier that interface with the electrochemical cells to electrically couple adjacent terminals of the electrochemical cells. Further, the bus bar carrier may include wings or guide extensions that extend from, for example, a perimeter of the bus bar carrier. The guide extensions are configured to facilitate ease of positioning the bus bar carrier into the open side of the housing and over the electrochemical cells. For example, the guide extensions exert a force on opposite sides of a stack of the electrochemical cells to guide the electrochemical cells into an appropriate position, such that the terminals of the electrochemical cells align properly with the bus bars disposed on the bus bar carrier.

Figure 1:
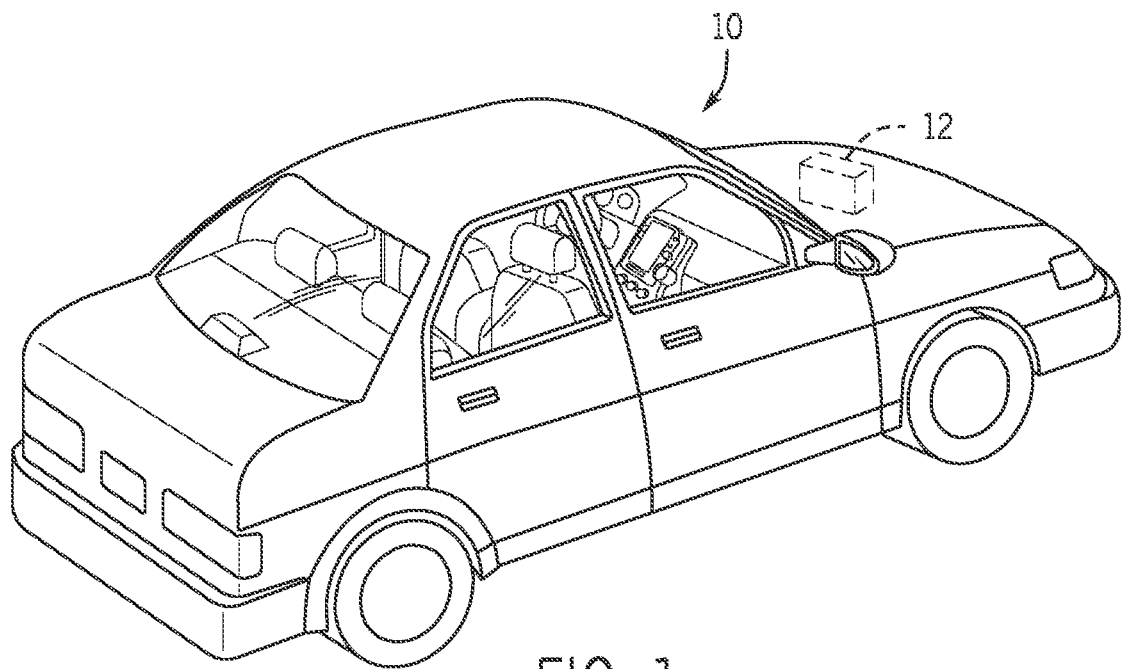
FIG. 1 is a perspective view of a vehicle having a battery system configured in accordance with present embodiments to provide power for various components of the vehicle.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
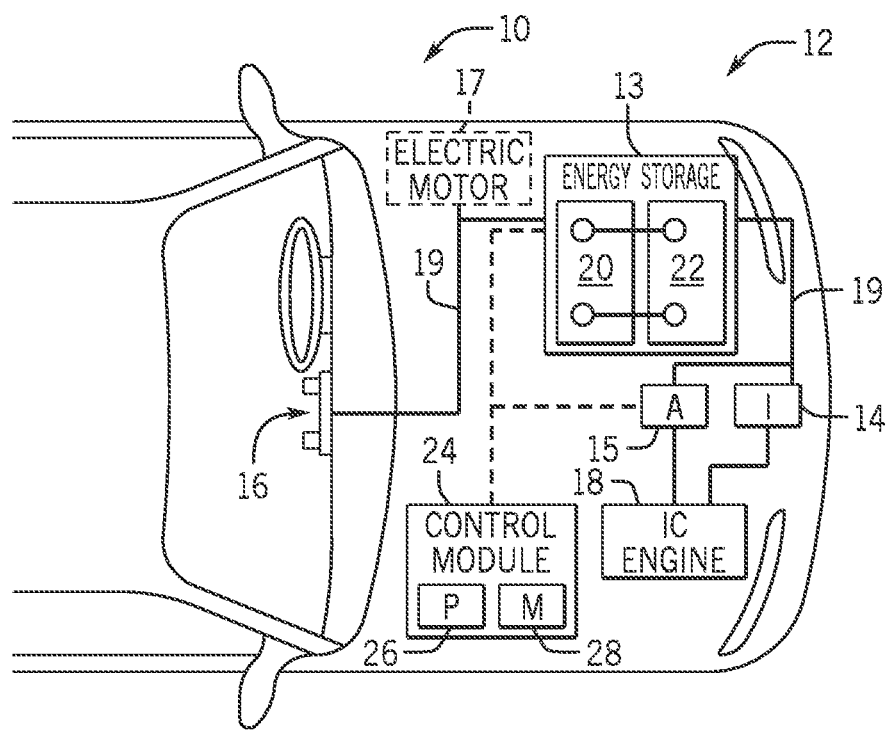
FIG. 2 is a cutaway schematic view of an embodiment of the vehicle and the battery system of FIG. 1.

A more detailed view of the battery system 12 is described in FIG. 2. As depicted, the battery system 12 includes an energy storage component 13 coupled to an ignition system 14, an alternator 15, a vehicle console 16, and optionally to an electric motor 17. Generally, the energy storage component 13 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 13 supplies power to the vehicle console 16 and the ignition system 14, which may be used to start (e.g., crank) the internal combustion engine 18.

Additionally, the energy storage component 13 may capture electrical energy generated by the alternator 15 and/or the electric motor 17. In some embodiments, the alternator 15 may generate electrical energy while the internal combustion engine 18 is running. More specifically, the alternator 15 may convert the mechanical energy produced by the rotation of the internal combustion engine 18 into electrical energy. Additionally or alternatively, when the vehicle 10 includes an electric motor 17, the electric motor 17 may generate electrical energy by converting mechanical energy produced by the movement of the vehicle 10 (e.g., rotation of the wheels) into electrical energy. Thus, in some embodiments, the energy storage component 13 may capture electrical energy generated by the alternator 15 and/or the electric motor 17 during regenerative braking. As such, the alternator 15 and/or the electric motor 17 are generally referred to herein as a regenerative braking system.

To facilitate capturing and supplying electric energy, the energy storage component 13 may be electrically coupled to the vehicle's electric system via a bus 19. For example, the bus 19 may enable the energy storage component 13 to receive electrical energy generated by the alternator 15 and/or the electric motor 17. Additionally, the bus 19 may enable the energy storage component 13 to output electrical energy to the ignition system 14 and/or the vehicle console 16. Accordingly, when a 12 volt battery system 12 is used, the bus 19 may carry electrical power typically between 8-18 volts.

Additionally, as depicted, the energy storage component 13 may include multiple battery modules. For example, in the depicted embodiment, the energy storage component 13 includes a lithium ion (e.g., a first) battery module 20 and a lead-acid (e.g., a second) battery module 22, which each includes one or more battery cells. In other embodiments, the energy storage component 13 may include any number of battery modules. Additionally, although the lithium ion battery module 20 and lead-acid battery module 22 are depicted adjacent to one another, they may be positioned in different areas around the vehicle. For example, the lead-acid battery module 22 may be positioned in or about the interior of the vehicle 10 while the lithium ion battery module 20 may be positioned under the hood of the vehicle 10.

In some embodiments, the energy storage component 13 may include multiple battery modules to utilize multiple different battery chemistries. For example, when the lithium ion battery module 20 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 24. More specifically, the control module 24 may control operations of components in the battery system 12, such as relays (e.g., switches) within energy storage component 13, the alternator 15, and/or the electric motor 17. For example, the control module 24 may regulate amount of electrical energy captured/supplied by each battery module 20 or 22 (e.g., to de-rate and re-rate the battery system 12), perform load balancing between the battery modules 20 and 22, determine a state of charge of each battery module 20 or 22, determine temperature of each battery module 20 or 22, control voltage output by the alternator 15 and/or the electric motor 17, and the like.

Accordingly, the control unit 24 may include one or more processor 26 and one or more memory 28. More specifically, the one or more processor 26 may include one or more application specific integrated circuits (ASICs), one or more field programmable gate arrays (FPGAs), one or more general purpose processors, or any combination thereof. Additionally, the one or more memory 28 may include volatile memory, such as random access memory (RAM), and/or non-volatile memory, such as read-only memory (ROM), optical drives, hard disc drives, or solid-state drives. In some embodiments, the control unit 24 may include portions of a vehicle control unit (VCU) and/or a separate battery control module.

Figure 3:
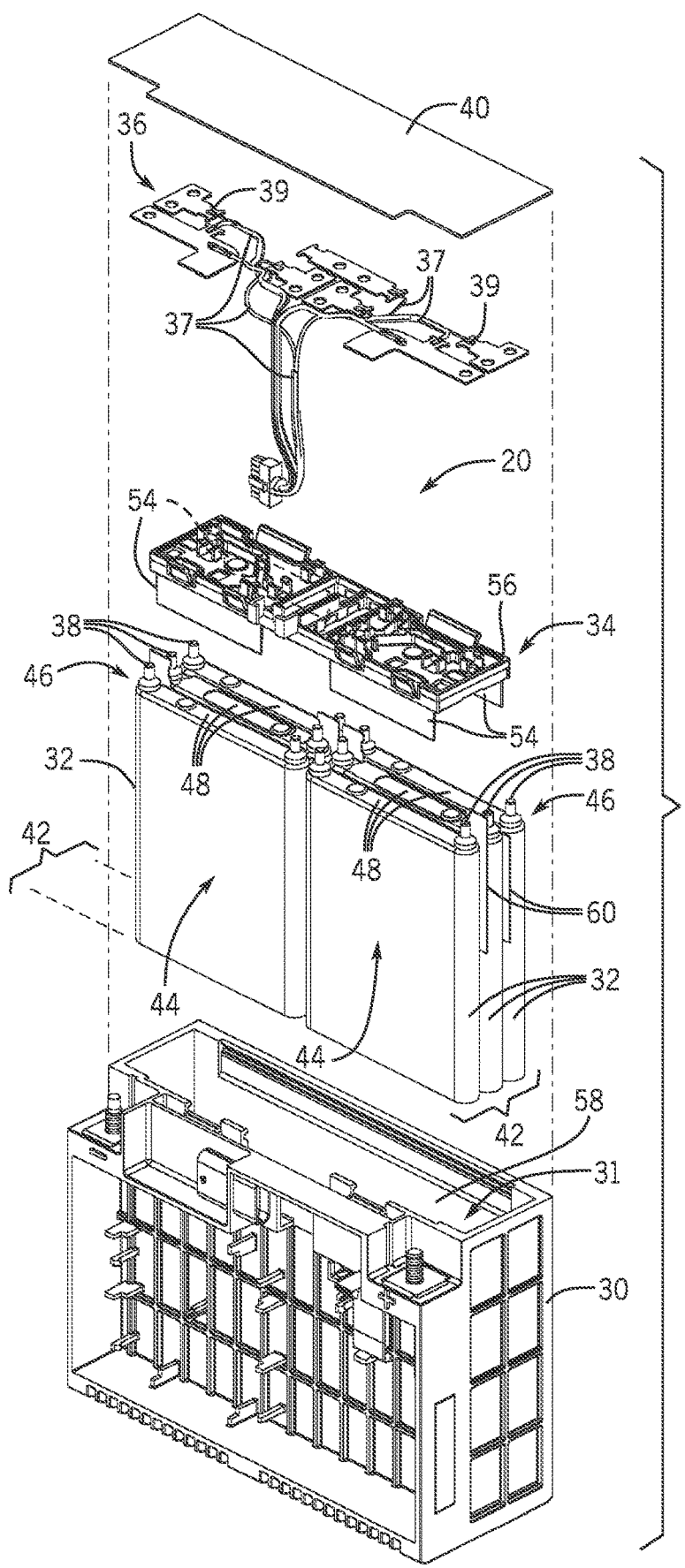
FIG. 3 is an exploded perspective view of an embodiment of a battery module for use in the vehicle of FIG. 2, in accordance with an aspect of the present disclosure.

An exploded perspective view of an embodiment of the battery module 20 for use in the vehicle 10 of FIG. 2 is shown in FIG. 3. In the illustrated embodiment, the battery module 20 includes a housing 30 (e.g., plastic housing) having an open side 31 configured to receive electrochemical cells 32 of the battery module 20. One or more covers may be disposed in and/or over the open side 31 of the housing 30 to interface with the electrochemical cells 32, to seal the open side 31 of the housing 30, or both. For example, in the illustrated embodiment, a bus bar carrier 34 is configured to be engage the open side 31 of the housing 30 and to retain a number of bus bars 36 (and, in some embodiments, sensors 37 and leads 39 interfacing with, and extending from, the bus bars 36) that interface with terminals 38 of the electrochemical cells 32. Further, a separate cover 40 may be disposed over the open side 31 of the housing 30 to seal the open side 31 after the bus bar carrier 34 is disposed in the open side 31. However, in some embodiments, the bus bar carrier 34 and the cover 40 may be one integral component.

As shown in the illustrated embodiment, the electrochemical cells 32 may be positioned within the housing 30 in stacks 42. For example, the electrochemical cells 32 may be prismatic, lithium-ion (Li-ion) electrochemical cells 32 having lateral faces 44 that are stacked one against the other to form one stack 42 of electrochemical cells 32. The illustrated housing 30 of the battery module 20 is configured to house two stacks 42 of three electrochemical cells 32 each, where the stacks 42 are positioned adjacent to each other in the housing 30 such that the lateral faces 44 of adjacent electrochemical cells 32 (e.g., across the two stacks 42) are disposed substantially in the same plane. It should be noted, however, that each stack 42 may include more or less than three electrochemical cells 32 (e.g., 2, 3, 4, 5, 6, 7, 8, or more electrochemical cells 32 per stack 42), and that the electrochemical cells 32 and corresponding stacks 42 may be otherwise oriented in the housing 30 such that the terminals 38 of the electrochemical cells 32 all extend from a terminal side 46 of each stack 42, where the terminal side 46 of each stack 42 includes terminal ends 48 (having the terminals 38) of the electrochemical cells 32. In other words, the electrochemical cells 32 are generally disposed in the housing 30 such that the terminals 38 of the electrochemical cells 32 all extend in substantially the same direction 50 and from a substantially equal plane (e.g., the terminal side 46 of each stack 42) for accessibility via the bus bar carrier 34.

In some embodiments, the bus bars 36 are disposed on and/or fixed to the bus bar carrier 34. For example, the bus bars 36 may snap into certain areas of the bus bar carrier 34. Accordingly, as the bus bar carrier 34 is disposed into the open side 31 of the housing 30 and over the terminal sides 46 of the stacks 42 of electrochemical cells 32, the bus bars 36 fixed to certain areas of the bus bar carrier 34 may interface with the terminals 38 of the electrochemical cells 32 to electrically couple the electrochemical cells 32 in series, in parallel, or certain of the electrochemical cells 32 in series and certain of the electrochemical cells 32 in parallel. However, due to manufacturing inconsistencies, engineering tolerances, and other factors, the terminals 38 of the electrochemical cells 32 may not extend in desired positions for interfacing with appropriate ones of the terminals 38 of the electrochemical cells 32. For example, certain of the terminals 38 may be misaligned in direction 50, direction 52, direction 55, or a combination thereof.

To encourage an appropriate interface between the bus bars 36 and appropriate ones of the terminals 38, the bus bar carrier 34 may include guide extensions 54 extending from the bus bar carrier 34 (e.g., from or proximate to a perimeter 56 of the bus bar carrier 34) downwardly (e.g., opposite to direction 50) toward the electrochemical cells 32 to guide the bus bar carrier 34 and the electrochemical cells 32 into appropriate positions for interfacing the bus bars 36 disposed on the bus bar carrier 34 with the terminals 38 of the electrochemical cells 32. For example, the guide extensions 54 may be configured to fit between an inner surface 58 of the housing 30 and the lateral faces 44 of the two outermost electrochemical cells 32 of each stack 42. Further, the guide extensions 54 may be configured to physically contact the lateral faces 44 of the two outermost electrochemical cells 32 of each stack 42 to compress the electrochemical cells 32 together, to guide positions of the terminals 38 relative to positions of the bus bars 36 disposed on the bus bar carrier 34, or a combination thereof. It should be noted that partitions or separator plates 60 may be included between the lateral faces 44 of the stacked electrochemical cells 32 to electrically isolate bodies of the electrochemical cells 32, to assist in electrically isolating certain of the terminals 38 that are not intended to be electrically coupled, or a combination thereof. The guide extensions 54 in such embodiments, then, my compress the electrochemical cells 32 and the partitions 60 together, where each stack 42 includes both the electrochemical cells 32 and the partitions 60.

Figure 4:
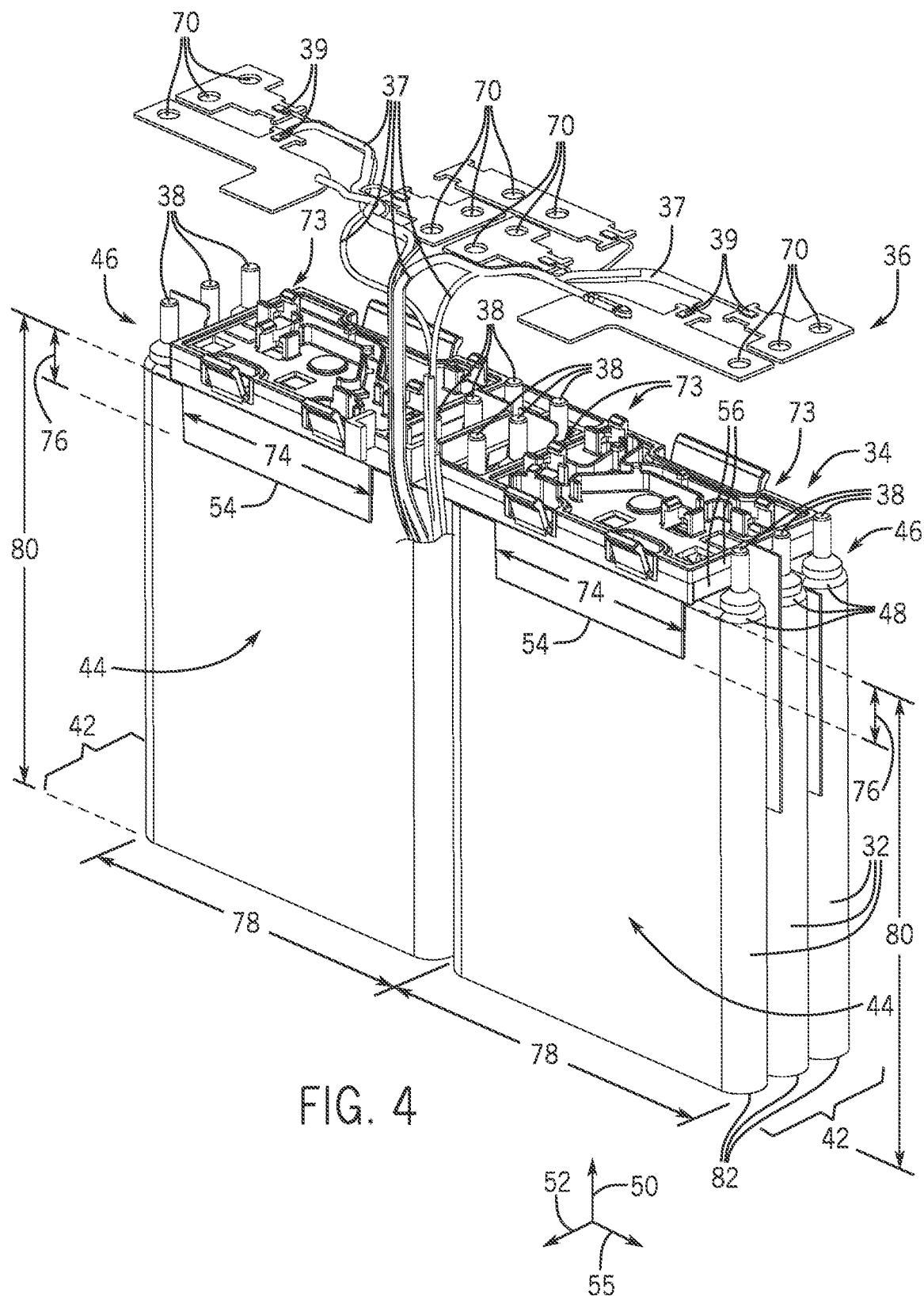
FIG. 4 is an exploded perspective view of a portion of an embodiment of the battery module of FIG. 3, in accordance with an aspect of the present disclosure.
Figure 5:
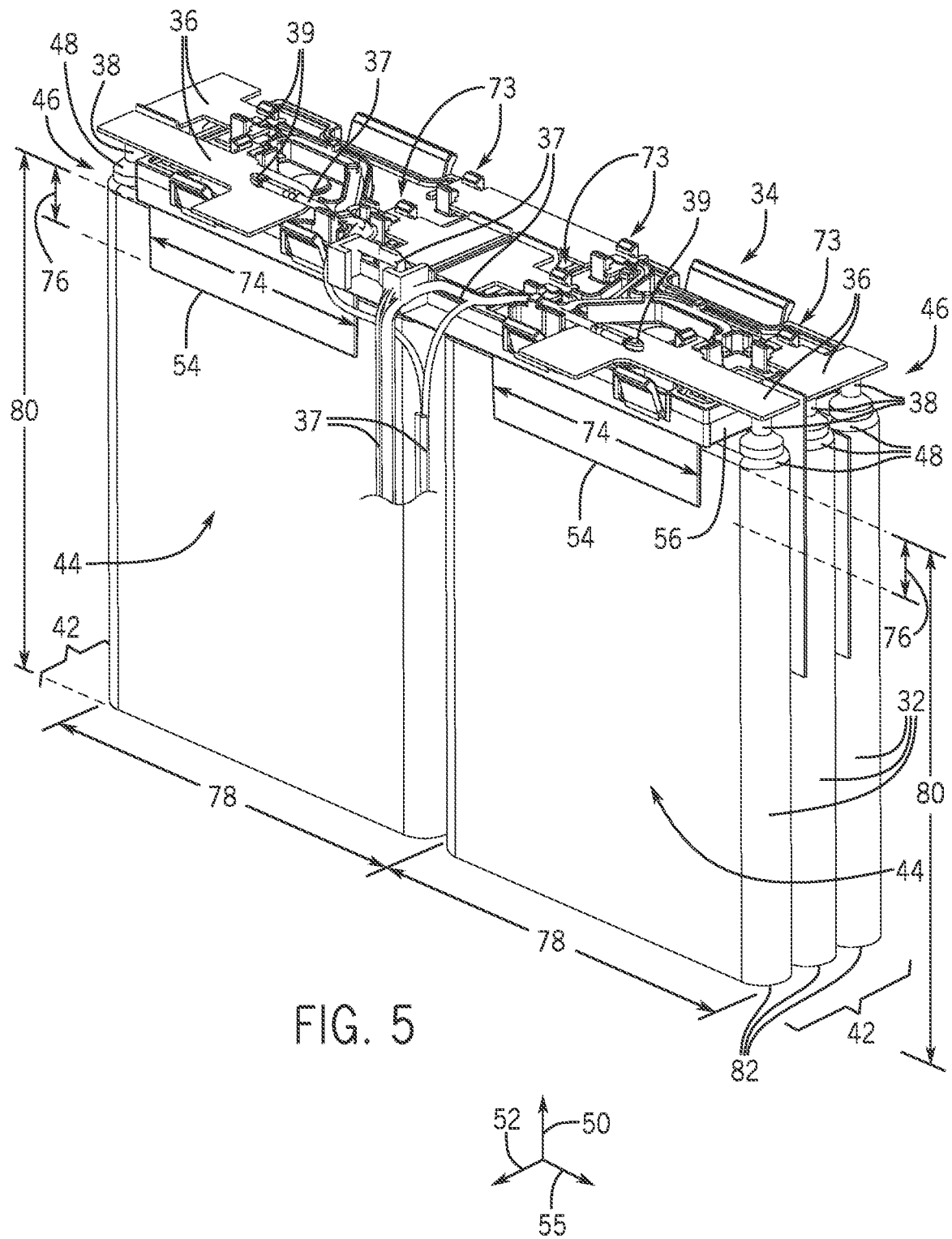
FIG. 5 is a perspective view of a portion of an embodiment of the battery module of FIG. 3, in accordance with an aspect of the present disclosure.

Turning now to FIGS. 4 and 5, an exploded perspective view and a perspective view, respectively, of a portion of an embodiment of the battery module 20 of FIG. 3 are shown. In the illustrated embodiments, the bus bar carrier 34 is disposed over the electrochemical cells 32 (e.g., over the terminal sides 46 of the stacks 42 of electrochemical cells 32 having the terminal ends 48 of the electrochemical cells 32). As shown in FIG. 4 the electrochemical cells 32 may include certain terminals 38 that extend upwardly from the terminal ends 48 of the electrochemical cells 32 outside the perimeter 56 of the bus bar carrier 34. Accordingly, certain of the bus bars 36 may be disposed on the bus bar carrier 34 such that the bus bars 36 extend beyond the perimeter 56 of the bus bar carrier 34 to interface with corresponding ones of the terminals 38. Further, it should be noted that the bus bars 36 may include openings 70, as shown in FIG. 4, to receive the terminals 38 of the electrochemical cells 32, or the bus bars 36 may be flat plates (e.g., without openings) as shown in FIG. 5, such that the terminals 38 contact the flat-plate bus bars 36 and, for example, are welded to the flat-plate bus bars 36. In both embodiments, the bus bar carrier 34 includes snap-in features 73 configured to receive the bus bars 36. The snap-in features 73 may permanently retain the bus bars 36 on the bus bar carrier 34, or the snap-in features 73 may temporarily retain the bus bars 36 on the bus bar carrier 34 until the bus bars 36 are secured to the bus bar carrier 34 via other means (e.g., adhesive, fasteners, welding) or until the bus bars 36 are secured to, for example, the terminals 38 via other means (e.g., welding). In some embodiments, the bus bars 36 may be embedded in, or over-molded with, the bus bar carrier 34.

As shown in both embodiments, the guide extensions 54 may extend downwardly (e.g., opposite to direction 50) and over portions of the lateral faces 44 of the two outermost electrochemical cells 32 of each stack 42. Thus, each stack 42 of electrochemical cells 32 is disposed between two opposing guide extensions 54 that compress the stack 42 of electrochemical cells 32 and/or guide the electrochemical cells 32 into appropriate positions such that the terminals 38 contact appropriate ones of the bus bars 36 and/or appropriate areas of appropriate ones of the bus bars 36. For example, the guide extensions 54 may guide the terminals 38 into the openings 70 of the bus bars 34 if the bus bars 34 include openings 70. In the illustrated embodiments of FIGS. 4 and 5, the guide extensions 54 each include a length 74 and a height 76. Further, each electrochemical cell 32 includes a length 78 and a height 80. The length 74 of the guide extension 54 may be at least approximately one half (50%), two thirds (67%), three fourths (75%), four fifths (80%) or more of the length 78 of each electrochemical cell 32 (e.g., where the length 78 of each electrochemical cell 32 is measured along a cross section of the electrochemical cell 32 in direction 55 or along the terminal end 48 of the electrochemical cell 32 in direction 55). The height 76 of each guide extension 54 may be at least approximately one third (33%), one quarter (25%), one fifth (20%), one tenth (10%) or less of the height 80 of each electrochemical cell 32 (e.g., where the height 80 of each electrochemical cell 32 is measured along a cross section of the electrochemical cell 32 in direction 50 or from the terminal end 48 of the electrochemical cell 32 to a base end 82 of the electrochemical cell 32 opposite to the terminal end 48). The guide extensions 54 may be sized to accommodate a desired force against the electrochemical cells 32 of the corresponding stack 42 (e.g., to ensure appropriate positioning of the terminals 38 relative to the bus bars 36 disposed on the bus bar carrier 34), to accommodate structural rigidity of the bus bar carrier 34 and the corresponding guide extensions 54, to reduce a total amount of material of the bus bar carrier 34, or a combination thereof.

Figure 6:
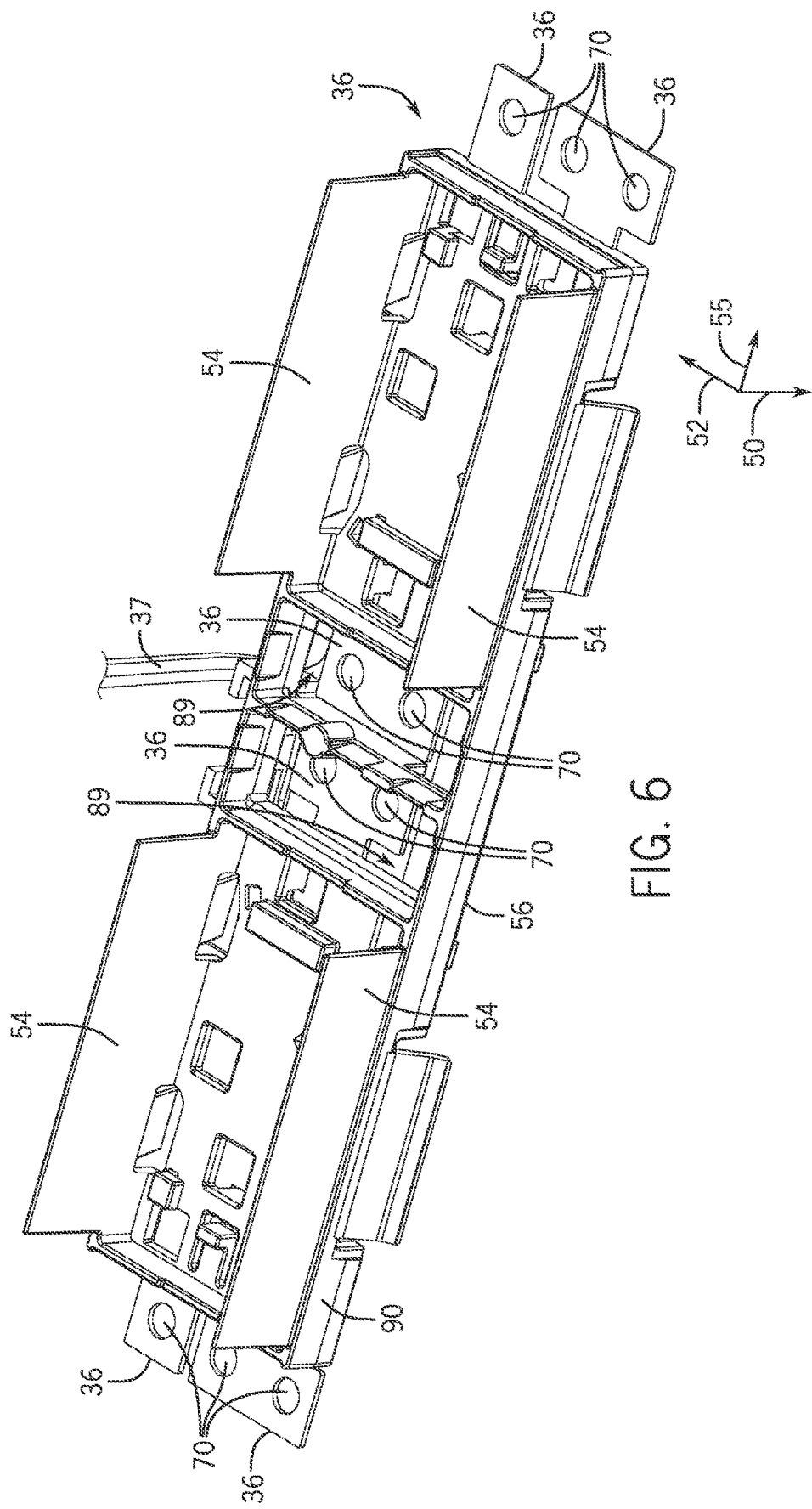
FIG. 6 is a bottom perspective view of an embodiment of the bus bar carrier and the bus bars of FIG. 4, in accordance with an aspect of the present disclosure.

A bottom perspective view of an embodiment of the bus bar carrier 34 having the bus bars 36 is shown in FIG. 6. As previously described, the bus bars 36 may be disposed on (e.g., fixed to) the bus bar carrier 34. Certain of the bus bars 36 may extend outside the perimeter 56 of the bus bar carrier 34 to interface with components of the battery module 20 (e.g., terminals 38 of electrochemical cells 32). Others of the bus bars 36 may be configured to interface with components of the battery module 20 (e.g., terminals 38 of electrochemical cells 32) through exposures 89 (e.g., openings) in the bus bar carrier 34. Indeed, in some embodiments, all the bus bars 36 may be contained within the perimeter 56 of the bus bar carrier 34, such that all the bus bars 36 contact one or more components of the battery module 20 (e.g., terminals 38 of the electrochemical cells 32) through exposures or openings 89 in the bus bar carrier 34. Further, the bus bars 36 include openings 70, although, in other embodiments, the bus bars 36 may be flat plates.

The guide extensions 54 extend from or proximate to the perimeter 56 of the bus bar carrier 34. It should be noted that the perimeter 56 may refer generally to an outer wall or outer walls of the bus bar carrier 34. Accordingly, the guide extensions 54 may extend from the perimeter 56 of the bus bar carrier 34 (e.g., from the outer walls of the bus bar carrier 34) even though the guide extensions 54 may not be flush with an outer surface 90 of the outer wall(s) that form the perimeter 56.

Figure 7:
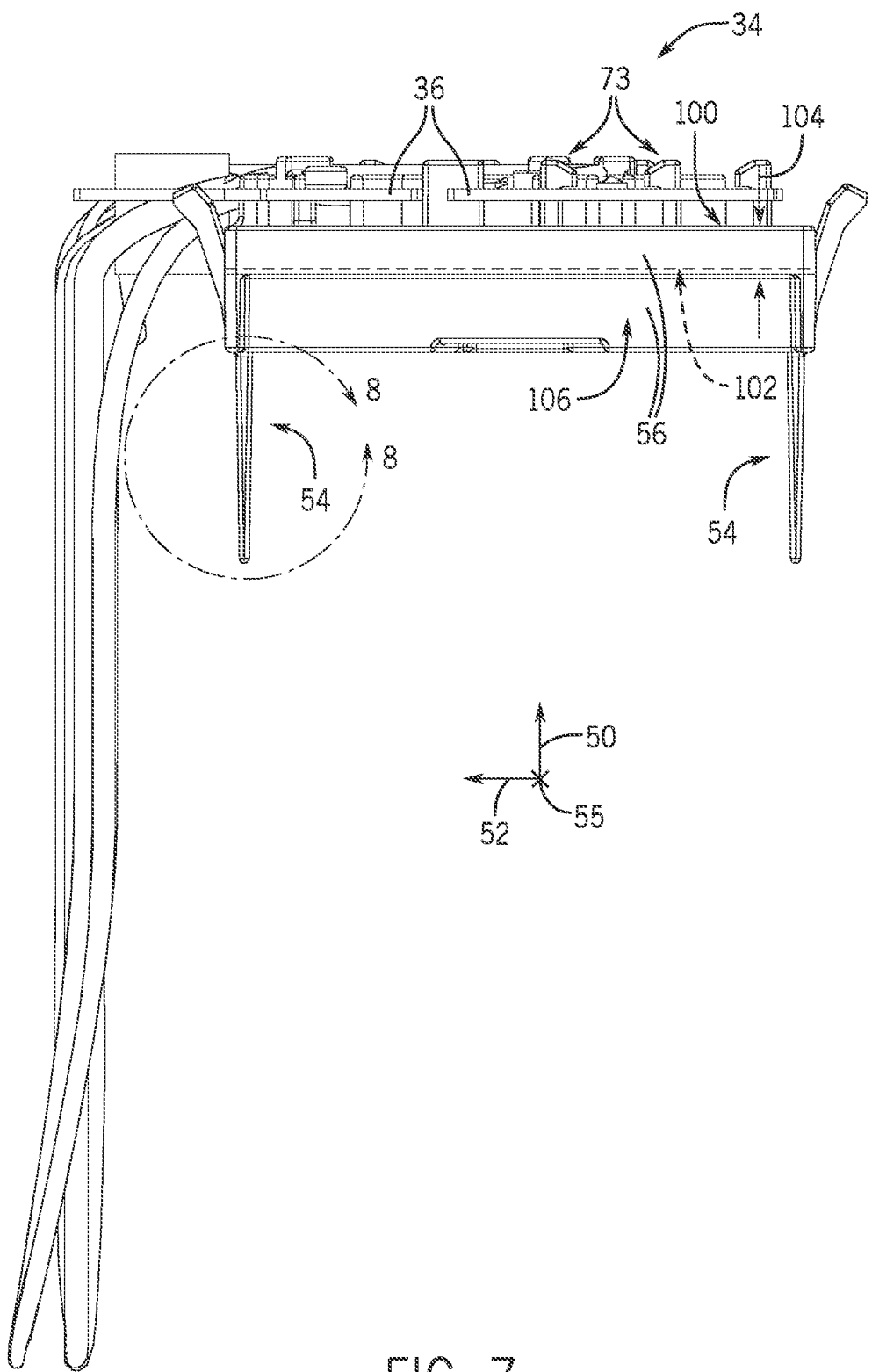
FIG. 7 is a side view of an embodiment of the bus bar carrier and the bus bars of FIG. 4, in accordance with an aspect of the present disclosure.

Turning now to FIG. 7, a side view of an embodiment of the bus bar carrier 34 having the bus bars 36 disposed thereon is shown. In the illustrated embodiment, the bus bar carrier 34 includes a top surface 100 that receives or retains the bus bars 36. The bus bar carrier 34 also includes a bottom surface 102 opposite to the top surface 110, where the bottom surface 102 faces the electrochemical cells 32 shown, for example, in FIGS. 3-6. A thickness 104 of the bus bar carrier 34 extends between the bottom surface 102 and the top surface 100. In certain embodiments, the thickness 104 may include exposures or openings, as previously described, that enable coupling of the bus bars 36 on the top surface 100 to access the terminals 38 of the electrochemical cells 32 shown in FIGS. 3-6. In certain embodiments, some or all of the bus bars 36 may be disposed on the bottom surface 102. Further, as previously described, the bus bar carrier 34 also includes the perimeter 56 from which the guide extensions 54 extend. The perimeter 56 may be defined by one or more outer walls of the bus bar carrier 34. For example, a lip 106 of the bus bar carrier 34 may extend from the bottom surface 102 of the bus bar carrier 34 downwardly (e.g., opposite to direction 50), where the lip 106 defines at least a portion of the perimeter 56. In some embodiments, the guide extensions 54 may extend from the lip 106. Additionally or alternatively, the guide extensions 54 may extend from the bottom surface 102 of the bus bar carrier 34 and inside of the lip 106.

Figure 8:
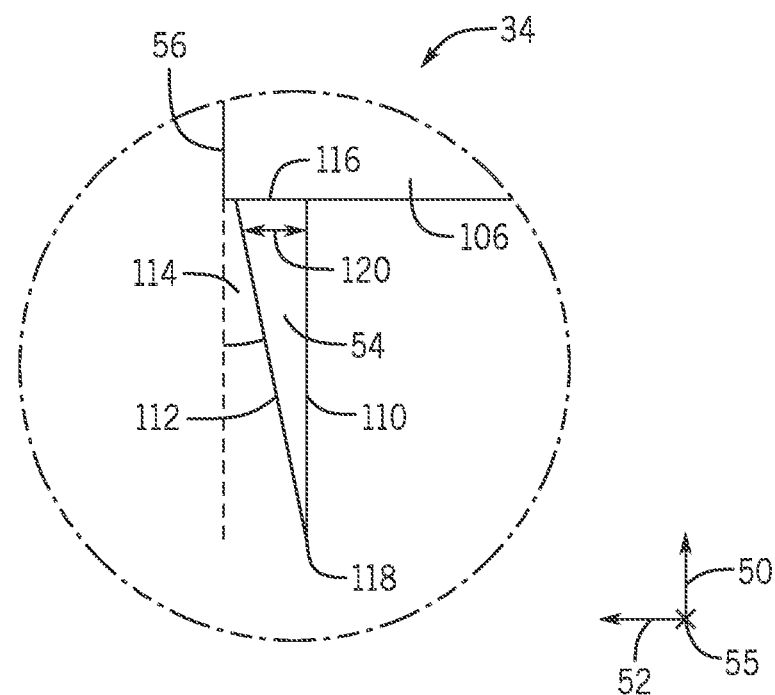
FIG. 8 is an expanded view of an embodiment of a guide extension of the bus bar carrier of FIG. 7 taken along lines 8-8 in FIG. 7, in accordance with an aspect of the present disclosure.

An expanded view of an embodiment of one of the guide extensions 54 of the bus bar carrier 34 taken along lines 8-8 in FIG. 7 is shown in FIG. 8. In the illustrated embodiment, the guide extension 54 includes an inner surface 110 (e.g., configured to contact one of the outermost electrochemical cells 32 shown in FIGS. 3-6) and an outer surface 112 opposite to the inner surface 110. In the illustrated embodiment, the inner surface 54 extends downwardly, substantially parallel with direction 50. The outer surface 112 is angled with respect to direction 50 at an angle 114. Generally, the outer surface 112 is angled such that the outer surface 112 tapers toward the inner surface 110 from a base 116 of the guide extension 54 (e.g., at a connection point between the guide extension 54 and the bus bar carrier 34) to a tip 118 of the guide extension 54 (e.g., from a proximal end to a distal end of the guide extension 54). Accordingly, a thickness 120 of the guide extension 54 decreases from the base 116 to the tip 118. The greater thickness 120 at the base 116 of the guide extension 54 enables increased structural rigidity of the guide extension 54. Accordingly, as the electrochemical cells 32 press into the guide extension 54 (e.g., during and/or after positioning the bus bar carrier 34 over the electrochemical cells 32 in FIGS. 3-6), the thicker base 116 may block the guide extension 54 from flexing and/or being negatively affected.

Figure 9:
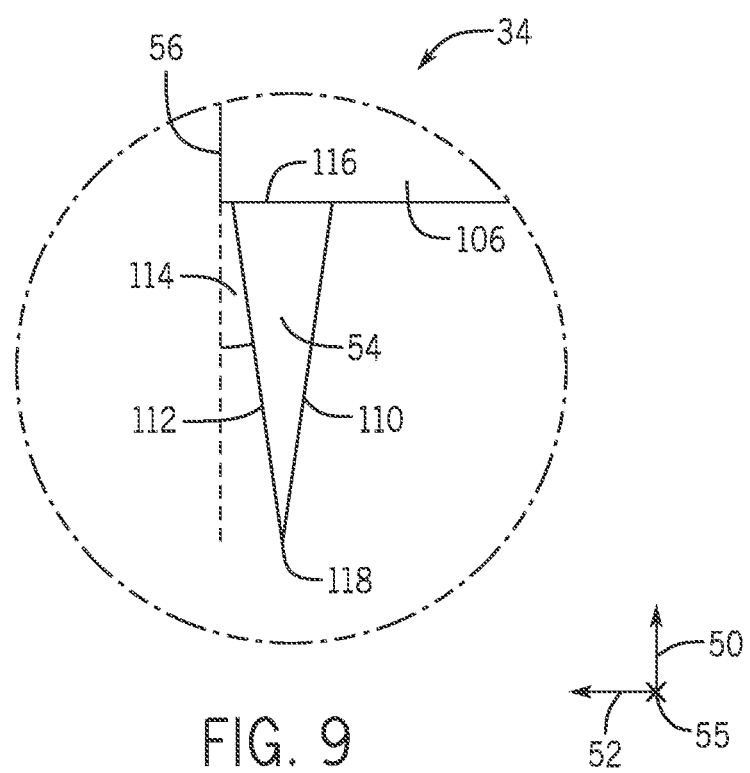
FIG. 9 is an expanded view of an embodiment of a guide extension of the bus bar carrier of FIG. 4, in accordance with an aspect of the present disclosure.

It should be noted, however, that the inner and outer surfaces 110, 112 of the guide extension 54 may be otherwise oriented in other embodiments. For example, the inner surface 110 may be angled outwardly, as shown in FIG. 9, such that an opening between opposing guide extensions 54 is larger proximate to the tips 118 of the opposing guide extensions 54 than proximate to the bases 116 of the opposing guide extensions 54, thereby facilitating reception of the electrochemical cells 32 within the opening such that the electrochemical cells 32 contact the opposing guide extensions 54 at some point between the tips 118 and the bases 116 of the opposing guide extensions.

Figure 10:
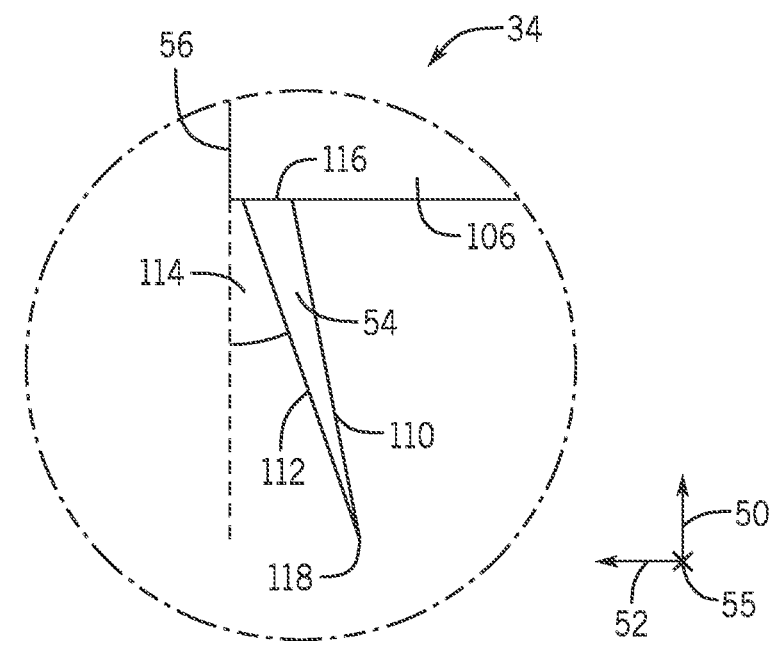
FIG. 10 is an expanded view of an embodiment of a guide extension of the bus bar carrier of FIG. 4, in accordance with an aspect of the present disclosure.

In some embodiments, the inner surface 110 may be angled inwardly (e.g., away from the outer surface 112), as shown in FIG. 10, such that an opening between opposing guide extensions 54 is larger proximate to the bases 116 of the opposing guide extensions 54 than proximate to the tips 118 of the opposing guide extensions 54. In such embodiments, the bus bar carrier 34 may be tilted or otherwise maneuvered to facilitate reception of the electrochemical cells 32 between the tips 118 of the opposing guide extensions 54. Further, in such embodiments, the guide extensions 54 may be flexed outwardly to facilitate reception of the electrochemical cells 32 between the tips 118 of the opposing guide extensions 54. Thus, after positioning the electrochemical cells 32 between the opposing guide extensions 54, the opposing guide extensions 54 may exert a force against the electrochemical cells 32 at the tips 118 of the opposing guide extensions 54.

Figure 11:
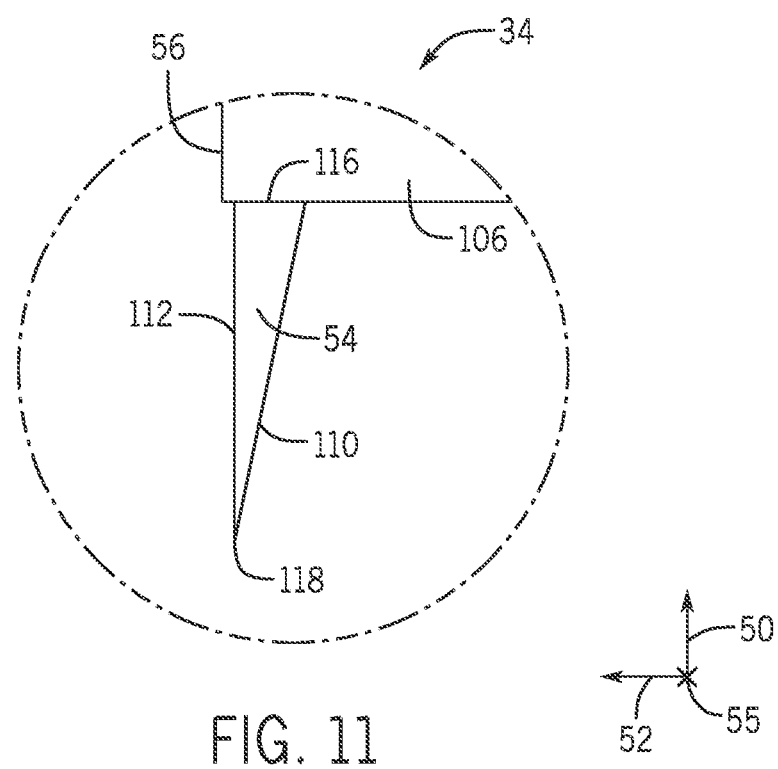
FIG. 11 is an expanded view of an embodiment of a guide extension of the bus bar carrier of FIG. 4.

In still other embodiments, the outer surface 112 may extend downwardly (e.g., substantially parallel with direction 50) such that angle 114 is approximately 0 degrees. For example, an embodiment of the bus bar carrier 34 having outer surface 112 extending substantially parallel with direction 50 is shown in FIG. 11. In the illustrated embodiment, the outer surface 112 extends parallel with direction 50 and the inner surface 110 is angled toward the outer surface 112 from the base 116 to the tip 118, such that the base 116 of the guide extension 54 includes a larger thickness 120 than the tip 118. Accordingly, the bus bar carrier 34 includes a larger opening proximate to the tip 118 than proximate to the base 116, facilitating positioning of the bus bar carrier 34 over the electrochemical cells 32 and enhancing structural integrity of the guide extension 54 and its connection point with the bus bar carrier 34 proximate to the base 116.

Figure 12:
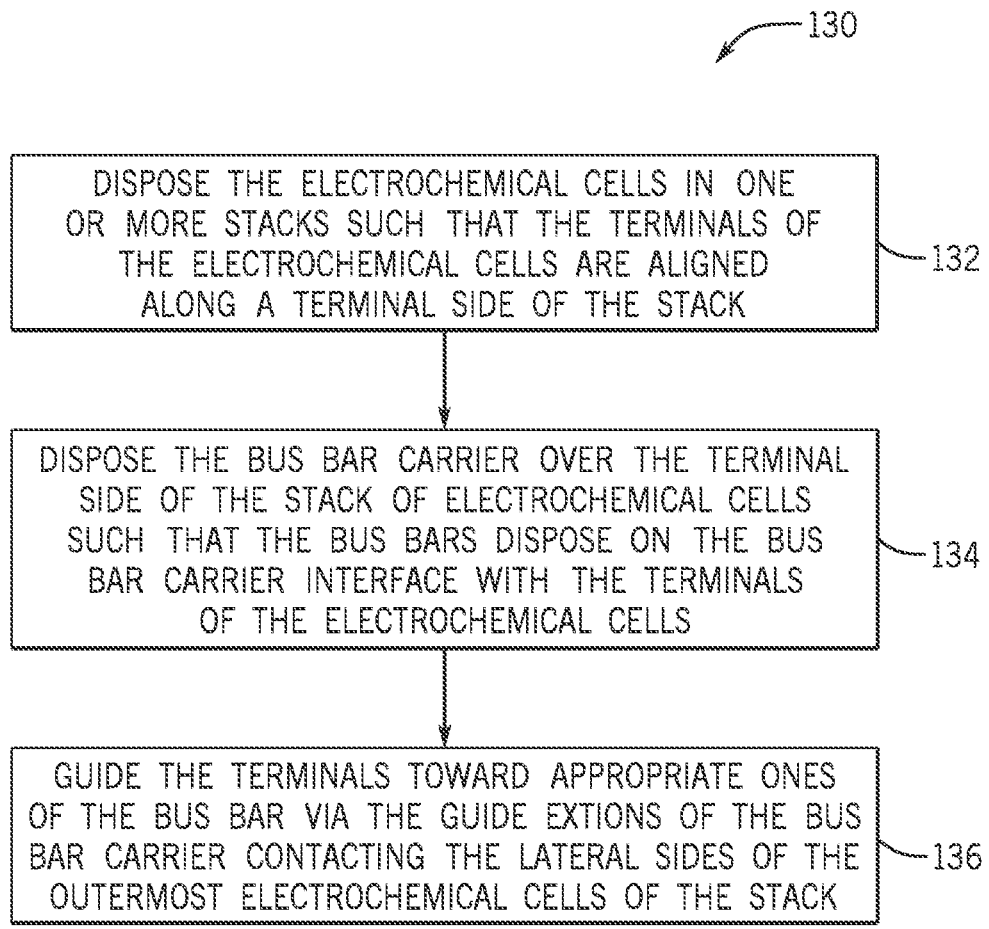
FIG. 12 is a process flow diagram of an embodiment of a method of manufacturing a battery module for use in the vehicle of FIG. 2, in accordance with an aspect of the present disclosure.

A process flow diagram of an embodiment of a method 130 of manufacturing the battery module 20 is shown in FIG. 12. In the illustrated embodiment, the method 130 includes disposing the electrochemical cells 32 in one or more stacks 42 such that the terminals 38 of the electrochemical cells 32 are at least partially aligned along the terminal side 46 of the stacks 42 (block 132). For example, as previously described, the electrochemical cells 32 may be stacked lateral face 44 against lateral face 44 to form one of the stacks 42. In some embodiments, this includes placing separators 60 between the lateral faces 44.

The method 130 also includes disposing the bus bar carrier 34 over the terminal side 46 of the stack 42 of electrochemical cells 32 such that the bus bars 36 disposed on the bus bar carrier 34 interface with the terminals 38 of the electrochemical cells 32 (block 134). For example, the bus bars 36 may be disposed on the top surface 100 of the bus bar carrier 34 opposite to the bottom surface 102, where the bottom surface 102 faces the terminal side 46 of the stack 42 of electrochemical cells 32. The bus bars 36 may interface with the terminals 38 of the electrochemical cells 32 through exposures 89 (e.g., openings) that extend from the bottom surface 102 to the top surface 100 of the bus bar carrier. Additionally or alternatively, certain of the bus bars 36 may interface with certain of the terminals 38 outside the perimeter 56 of the bus bar carrier 34.

Further, the method 130 also includes guiding the terminals 38 toward appropriate ones of the bus bars 36 via the guide extensions 54 of the bus bar carrier 34 contacting the lateral faces 44 of the outermost electrochemical cells 32 of the stack 42 (block 136).

It should be noted that, in all of the embodiments described above, the bus bars 36 may be coupled to the terminals 38 of the electrochemical cells 32 via welds. For this and other reasons, the guide extensions 54 may only guide positioning of the electrochemical cells 32 and their associated terminals 38 until the terminals 38 are coupled to appropriate areas of appropriate ones of the bus bars 34. The guide extensions 54 may continue to physically contact the electrochemical cells 32 (e.g., the lateral faces 44 of the electrochemical cells 32) after coupling of the terminals 38 to the bus bars 34, or the guide extensions 54 may not continue to physically contact the electrochemical cells 34 (e.g., the lateral faces 44 of the electrochemical cells 32) after coupling of the terminals 38 to the bus bars 34. Further, the guide extensions 54 may transiently contact the electrochemical cells 34 depending on operating conditions of the battery module 20. For example, during operation, the electrochemical cells 32 may thermally expand toward the guide extensions 54, causing the guide extensions 54 to physically contact the electrochemical cells 32. Accordingly, it should be understood that "physically contact" in accordance with the present disclosure may refer to a temporary relationship, a transient relationship, or a permanent relationship between two or more entities or components.

One or more of the disclosed embodiments, alone or in combination, may provide one or more technical effects useful in the manufacture of battery modules, and portions of battery modules. In general, embodiments of the present disclosure include a battery module having electrochemical cells disposed in a housing and a bus bar carrier disposed over the electrochemical cells. The bus bar carrier includes bus bars disposed thereon that interface with terminals of the electrochemical cells. Further, the bus bar carrier includes guide extensions extending from the bus bar carrier toward the electrochemical cells and configured to guide a positioning of the electrochemical cells and their corresponding terminals toward appropriate areas of appropriate ones of the bus bars. The guide extensions may be sized and/or shaped to accommodate a specific amount of force against the electrochemical cells to enable the aforementioned positioning of the electrochemical cells and their corresponding terminals relative to the bus bars disposed on the bus bar carrier having the guide extensions. The guide extensions may also make the associated battery module more robust by holding the electrochemical cells together in a compressed and more structurally sound relationship. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. A battery module, comprising:
   a housing having an interior surface;
   a stack of electrochemical cells disposed in the housing, the stack including;
      a first end and a second end opposite the first end, the first end having terminals of the electrochemical cells,
      a first surface and a second surface of a first electrochemical cell and a second electrochemical cell, respectively, the first surface and the second surface extending between the first end and the second end of the stack;
   a plurality of bus bars; and
   a bus bar carrier supporting the plurality of bus bars, the bus bar carrier being adjacent to the first end of the stack such that the plurality of bus bars interfaces with the terminals of the first end, the bus bar carrier having a first guide extension and a second guide extension, the first guide extension including a third surface and a fourth surface opposite the third surface, the second guide extension including a fifth surface and a sixth surface opposite the fifth surface, the third surface physically contacting the first surface, the fourth surface physically contacting the interior surface of the housing, and the fifth surface physically contacting the second surface, wherein the fifth surface and the sixth surface are tapered from the bus bar carrier toward a distal tip of the second guide extension such that a base of the second guide extension includes a larger thickness than the tip of the second guide extension, and wherein the fifth surface and sixth surface each extend between the base and the tip of the second guide extension.

2. The battery module of claim 1, wherein the stack of electrochemical cells comprises three electrochemical cells.

3. The battery module of claim 2, further comprising:
   a second stack of electrochemical cells having three electrochemical cells disposed in the housing, the second stack including a third end and a fourth end opposite the third end, the third end having second terminals of the electrochemical cells;
   a second plurality of bus bars; and
   wherein the bus bar carrier further supports the second plurality of bus bars, the bus bar carrier being further adjacent to the third end of the second stack such that the second plurality of bus bars interfaces with the second terminals of the third end.

4. The battery module of claim 3, wherein the plurality of bus bars and the second plurality of bus bars include a bus bar that interfaces with at least one terminal of the first terminals and at least one terminal of the second terminals.

5. The battery module of claim 1, wherein the plurality of bus bars is fixedly secured to the bus bar carrier.

6. The battery module of claim 1, wherein the bus bar carrier includes a first side facing the stack of electrochemical cells, a second side opposite to the first side, and a thickness between the first and second sides, and wherein the plurality of bus bars is fixed to the bus bar carrier on the second side of the bus bar carrier.

7. The battery module of claim 1, wherein certain of the plurality of bus bars contacts terminals of the stack of electrochemical cells through openings in the bus bar carrier.

8. The battery module of claim 1, wherein the first guide extension and the second guide extension help guide the terminals of the stack of electrochemical cells toward appropriate ones of the plurality of bus bars disposed on the bus bar carrier.

9. The battery module of claim 1, wherein the first guide extension and the second guide extension help compress the electrochemical cells of the stack together such that the terminals are aligned with corresponding ones of the plurality of bus bars.

10. The battery module of claim 1, wherein the first guide extension and the second guide extension extend from or are proximate to opposing sides of a perimeter of the bus bar carrier.

11. The battery module of claim 1, wherein the housing includes an open side configured to receive the electrochemical cells such that the electrochemical cells are disposed in the stack on an inside of the housing, wherein the bus bar carrier is disposed in the open side of the housing such that the bus bars disposed on the bus bar carrier interface with the terminals of the electrochemical cells.

12. The battery module of claim 1, further comprising a plurality of partitions, each partition of the plurality of partitions being disposed between two electrochemical cells of the stack of electrochemical cells.

\* \* \* \* \*